(12) United States Patent
Sobel et al.

(10) Patent No.: US 7,110,653 B2
(45) Date of Patent: Sep. 19, 2006

(54) OPTICAL NETWORK UNIT

(75) Inventors: Jay Richard Sobel, Ottawa (CA); Steve Daniel Armstrong, Stittsville (CA)

(73) Assignee: Alcatel Canada Inc., Ottawa (CA)

( * ) Notice: Subject to any disclaimer, the term of this patent is extended or adjusted under 35 U.S.C. 154(b) by 0 days.

(21) Appl. No.: 10/219,337

(22) Filed: Aug. 16, 2002

(65) Prior Publication Data

US 2003/0118312 A1 Jun. 26, 2003

Related U.S. Application Data

(60) Provisional application No. 60/341,220, filed on Dec. 20, 2001.

(51) Int. Cl.
*G02B 6/00* (2006.01)
(52) U.S. Cl. ..................................... 385/135; 439/142
(58) Field of Classification Search ........ 385/134–139; 439/142, 718
See application file for complete search history.

(56) References Cited

U.S. PATENT DOCUMENTS

| 4,811,168 | A |   | 3/1989 | Chesnut et al. |         |
|-----------|---|---|--------|----------------|---------|
| 5,061,193 | A | * | 10/1991 | Seaman        | 439/76.1 |
| 5,267,122 | A |   | 11/1993 | Glover et al. |         |
| 5,362,254 | A | * | 11/1994 | Siemon et al. | 439/536 |
| 5,828,807 | A |   | 10/1998 | Tucker et al. | 385/135 |
| 5,982,972 | A |   | 11/1999 | Tucker et al. | 385/135 |
| 6,007,353 | A | * | 12/1999 | Webster       | 439/142 |
| 6,065,530 | A | * | 5/2000  | Austin et al. | 165/80.3 |
| 6,438,308 | B1| * | 8/2002  | Philips et al.| 385/135 |
| 6,997,622 | B1| * | 2/2006  | Dodds et al.  | 385/92  |

FOREIGN PATENT DOCUMENTS

CN    2410741 Y    12/2000

* cited by examiner

*Primary Examiner*—Khiem Nguyen
(74) *Attorney, Agent, or Firm*—Jim Zegeer

(57) ABSTRACT

An optical network unit having an environmentally sealed printed circuit board arrangement within a first compartment and a signal in/out arrangement in a second compartment. The compartments are provided by two housings. Instead of replacing individual circuit boards in the case of breakdown or malfunction, replacement of the whole of the printed circuit board arrangement is necessary thereby eliminating human error and minimizing downtime. Two housings provide the two compartments. These housings are preferably mounted upon a housing mount and a carrier for the optical network unit is also preferably mounted upon the housing mount. This housing and carrier arrangement simplifies assembly and disassembly of parts of the unit for maintenance and replacement purposes.

9 Claims, 12 Drawing Sheets

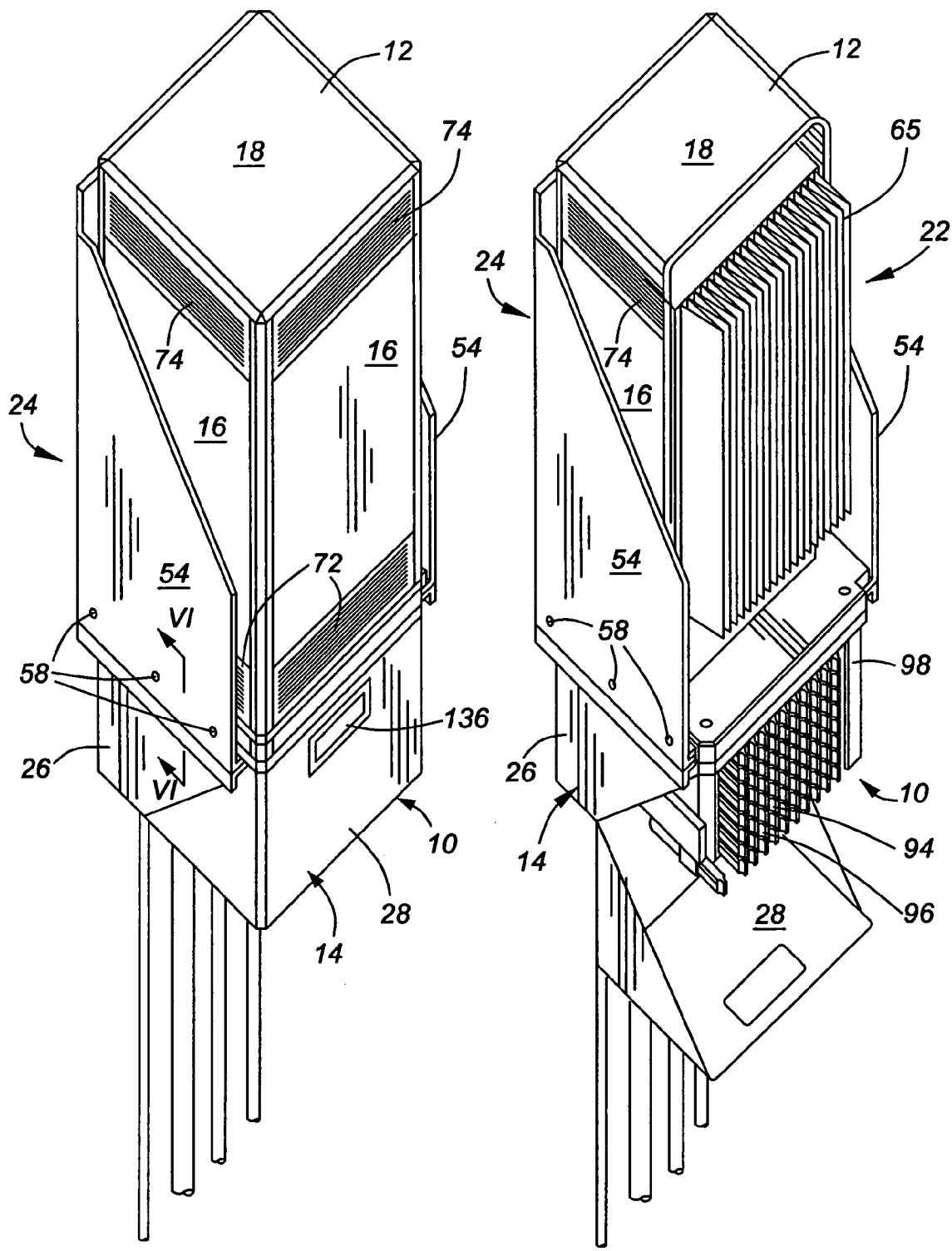
FIG. 1  FIG. 2

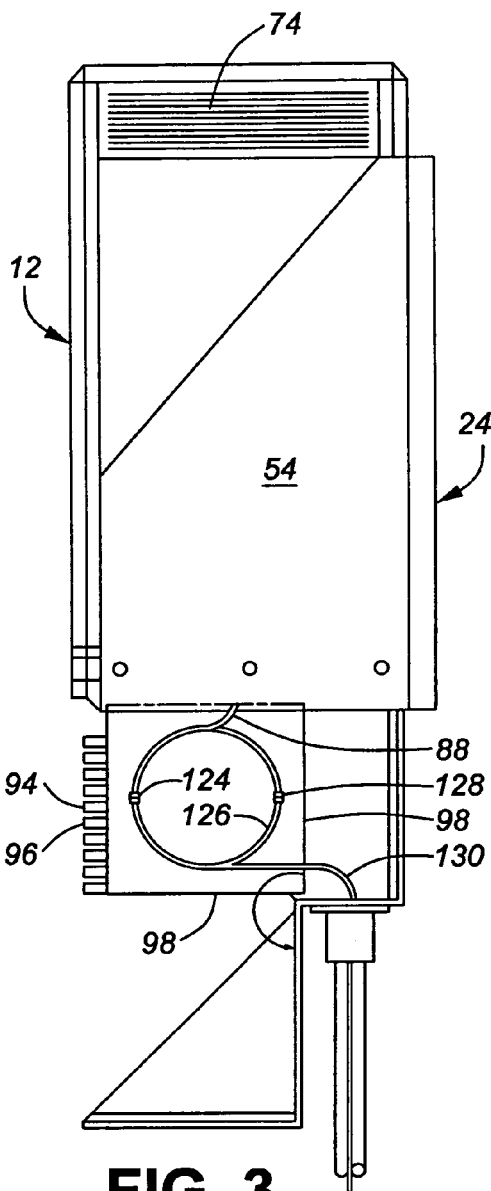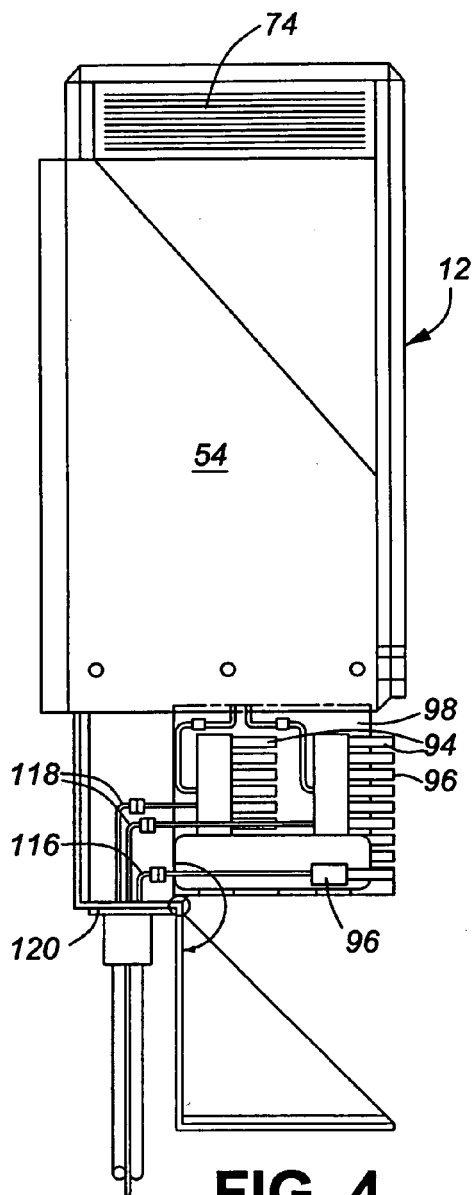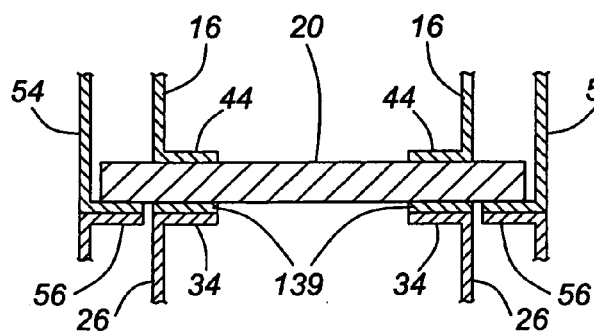

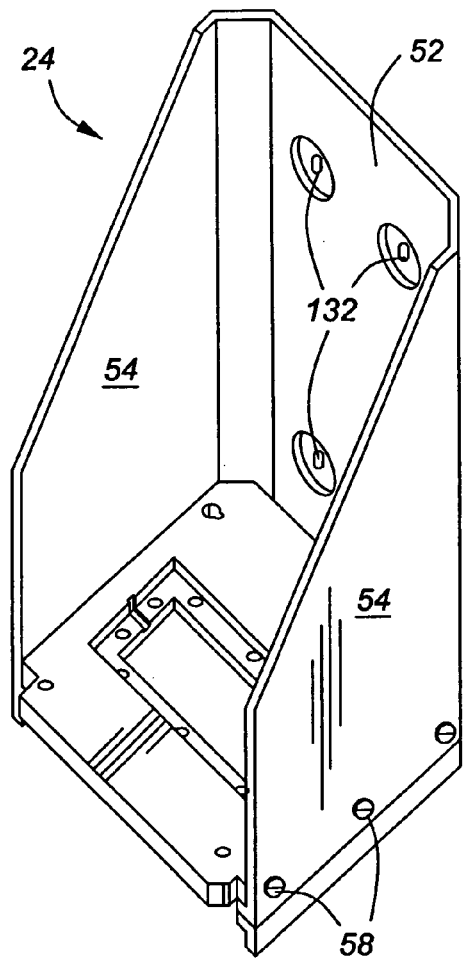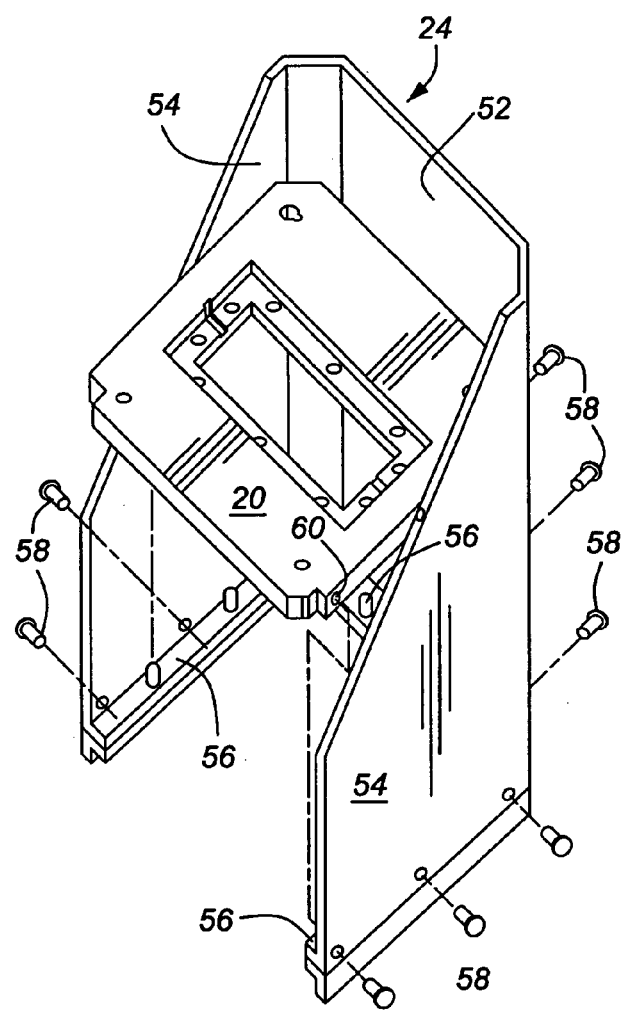
FIG. 14  FIG. 15

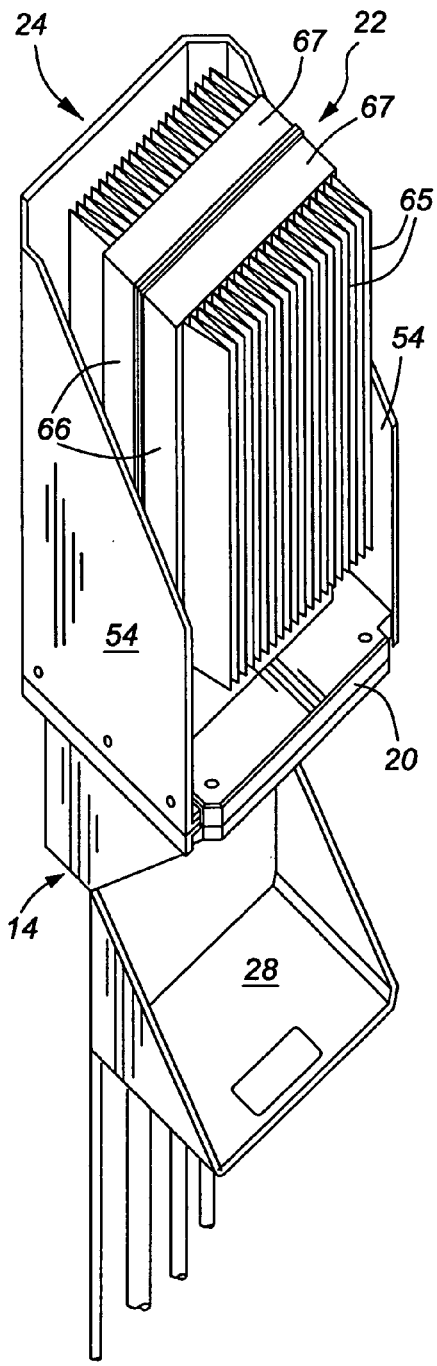
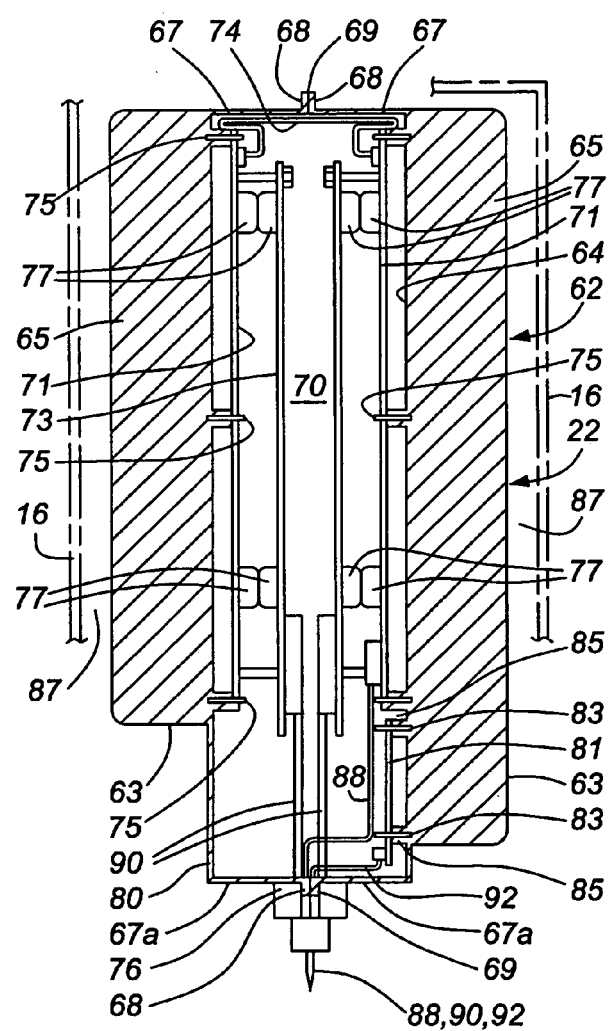
FIG. 18
FIG. 19

OPTICAL NETWORK UNIT

This application claims the benefit of Provisional Application No. 60/341,220, filed Dec. 20, 2001.

FIELD OF THE INVENTION

This invention relates to optical network units.

BACKGROUND OF THE INVENTION

Optical network units are conventionally placed close to customers' premises, e.g. businesses or homes. These units are connected to central offices by optical fibers and/or copper pairs. Signals received from these fibers and copper pairs are converted into electrical signals which are then transmitted along relatively short electrical conductors to the customers' premises. Electrical signals, in the frequency range above the voice band, received from the customers are converted by the optical network units into optical signals which are transmitted by the optical fibers to the central office. Electrical signals in the voice band received from the customer are transmitted to the central office on the copper pairs. Normally it is expected that an optical network unit is situated adjacent to equipment known by various terms such as a joint wiring interconnect, outside wiring interface, serving area interconnect or feeder distribution interface. This equipment connects the optical network unit to the customer's line to transfer the voice, data, video, high definition broad band and XDSL signals to the customer.

Optical network units are located outside customers' premises whereby they are subject to ambient temperature, wind and humidity conditions. For protection against these conditions and against vandalism, a housing is required to provide suitable protection to the circuitry, connections and any other features within the housing and upon which an optical network unit depends for operation.

In order to provide for their functional requirements, there are various designs of optical network units. In one particular design, e.g. as shown in U.S. Pat. Nos. 5,828,807 and 5,982,972, a frame has two compartments each having an opening. One compartment houses the electronics and optics of the optical network unit, and the second compartment houses a drop terminal block or blocks of the unit. Doors are provided for covering and sealing the openings when the unit is in use. The doors have a gull-wing design which enables them to be rotated upwards when the interior of the optical network is to be accessed. Catches or struts are provided to hold the doors in open positions, thereby freeing the hands of a technician working on the unit with the unit mounted horizontally, in which position the doors rotate by horizontal axes. With the doors open, each door thus overhangs its opening with the intention of preventing rain from entering its associated compartment.

One problem that may exist with the structure as described in the above patents, is that the internal environment for the electronics and optical components, is not controlled. Since field replaceable line cards are intended to be serviced through manual exchange through the opening to the appropriate compartment, humidity that enters the compartment, when the door is opened, is trapped inside the compartment after the door is closed, to seal the compartment. This humidity may affect the performance and reliability of the product, as the humidity, either as airborne mist or as heat-condensed droplets of water, may cause corrosion of electronic components and/or shorting out of the power supply. This would interfere with electrical signalling and/or power distribution. Even when new line cards are inserted into the compartment, the expected operating time, as required by industry standards, may be compromised due to the undesirable humid internal environment. In addition, the direction of wind-driven rain may be subject to change under certain uncontrollable environmental conditions. As a result, the doors when in open condition may not always prevent rain from entering the compartment. Wind-driven rain entering the electronics and optical compartment during service has similar potential for compromising the reliability and performance of the unit through corrosion and shorting out, as does trapped humidity.

A further problem that may exist with the above type of design relates to how the design affords the opportunity for human error to occur during service. Extended down time may be due to the exchange of line cards, which do not require exchange, and which are mistakenly identified as inoperable line cards. This would result in unnecessary delays in returning an optical network unit to its desirable function. It has been shown that in different types of electronic equipment, unnecessarily exchanging correctly operating line cards, where incorrectly operating cards should be exchanged, is a real and practical problem. Upon such mistakes being made, the problem may become intensified, thereby leading to further delay, when upon providing power to the unit once again, it is still found to be operating incorrectly. Such unnecessary delays, apart from economical considerations, and wastage of technicians' time, are likely to lead to customers' dissatisfaction due to extended lack of service.

SUMMARY OF THE INVENTION

The present invention seeks to provide an optical network unit in use of which the above problems are avoided or minimised.

According to one aspect of the present invention, there is provided an optical network unit comprising: a housed environmentally sealed printed circuit board arrangement; a housed telecommunications signal in/out arrangement interconnected for signal transmission to the printed circuit board arrangement; and means to provide access to each of the printed circuit board and signal in/out arrangements.

Units according to the invention defined above are not subject to humidity effects suffered by the optical and electronics components because the surrounding environment is unable to contact such components, because they are environmentally sealed. Thus any moisture present or rain driven into contact with the environmentally sealed arrangement can have no effect upon its performance.

In addition, upon failure of any of the optical or electronic components in the sealed arrangement, human error cannot occur during servicing. This is because printed circuit boards (or line cards) are not changed individually so that an incorrect circuit board cannot be replaced in times of breakdown in service. With the present invention, any breakdown in service of the printed circuit board arrangement necessarily requires its complete exchange for a new environmentally sealed printed board arrangement. Thus delays and expense caused by human error in returning to customer service after breakdown, are prevented from occurring.

In a preferred arrangement, a first housing member provides at least part of a first compartment containing the printed circuit board arrangement, and a second housing member provides at least part of a second compartment containing the signal in/out arrangement. It is envisaged that the first and second compartments may be defined within housings which are completely separate and may be spaced from each other. However, the preferred arrangement comprises a housing mount to which each housing member is detachably assembled. It is also to be preferred that the printed circuit board arrangement is also detachably assembled to the housing mount. This allows for a simplified structure. It is also advantageous that the first housing member defines sides and one end of the first compartment, the other end of which is defined by the housing mount. Hence, upon removal of the first housing member from the housing mount, the printed circuit board arrangement is fully exposed extending from the housing mount to enable it to be removed and replaced.

Further, it is convenient for the second housing member to have a closure element across an access opening and to enable securing means holding the housing members to the housing mount to be accessible through the opening for removal of the housing members.

It is also preferable to provide vertically spaced air vents in the first housing member to allow cooling air to flow upwards through a passage defined between that housing member and the printed circuit board arrangement for cooling purposes. This avoids the possible necessity of having electrically driven fan arrangements for cooling purposes and which could be subject to break down.

The invention further includes an assembly of an optical network unit as defined according to the invention above and a carrier member for the optical network unit. The carrier member enables the optical network unit to be mounted in a fixed position to some rigid structure. In this further form of the invention, the carrier member is also detachably assembled to the housing mount which also assists in providing a simple structure, in which the housing mount provides the base unit for all of the components.

The invention also includes an optical network unit in which the first and second compartments are upper and lower compartments respectively. In these structures the environmentally sealed printed circuit board arrangement is located in the upper compartment, and any heat generated by this arrangement not only tends to move in an upward direction, but is also driven upwards by the convection airflow, thereby moving the heat away from the signal in/out arrangement.

With the above latter structure, the housing members lie on opposite sides of the housing mount. However, it is envisioned that in other structures the housing mount may carry, on one of its sides only, both of the housing members, together with the enviromentally sealed printed circuit board arrangement and the signal in/out arrangement. The housing members may or may not lie side-by-side or one above another in these other structures.

BRIEF DESCRIPTION OF THE DRAWINGS

One embodiment of the invention will now be described, by way of example, with reference to the accompanying drawings, in which:

FIG. 1 is a front isometric view of an assembly of an optical network unit of the embodiment and a carrier member;

FIG. 2 is a view similar to FIG. 1 with an upper housing member sectioned and a lower housing member open;

FIG. 3 is a view showing the righthand side of the assembly with the lower housing member open and in section to show inside detail;

FIG. 4 is a view similar to FIG. 3 of the lefthand side of the assembly;

FIG. 6 is a scrap cross-sectional view of the assembly taken along line Vl—Vl in FIG. 1 with inside features omitted for clarity;

FIG. 14 is a front isometric view of a sub-assembly of the housing mount and the carrier member;

FIG. 15 is an exploded front isometric view of the sub-assembly of FIG. 14;

FIG. 18 is a view similar to FIG. 2 of the assembly and with the upper housing member removed;

FIG. 19 is a cross-sectional view through the environmentally sealed printed circuit board arrangement, taken along line XlX—XlX in FIG. 11;

DESCRIPTION OF PREFERRED EMBODIMENT

Figure 5:
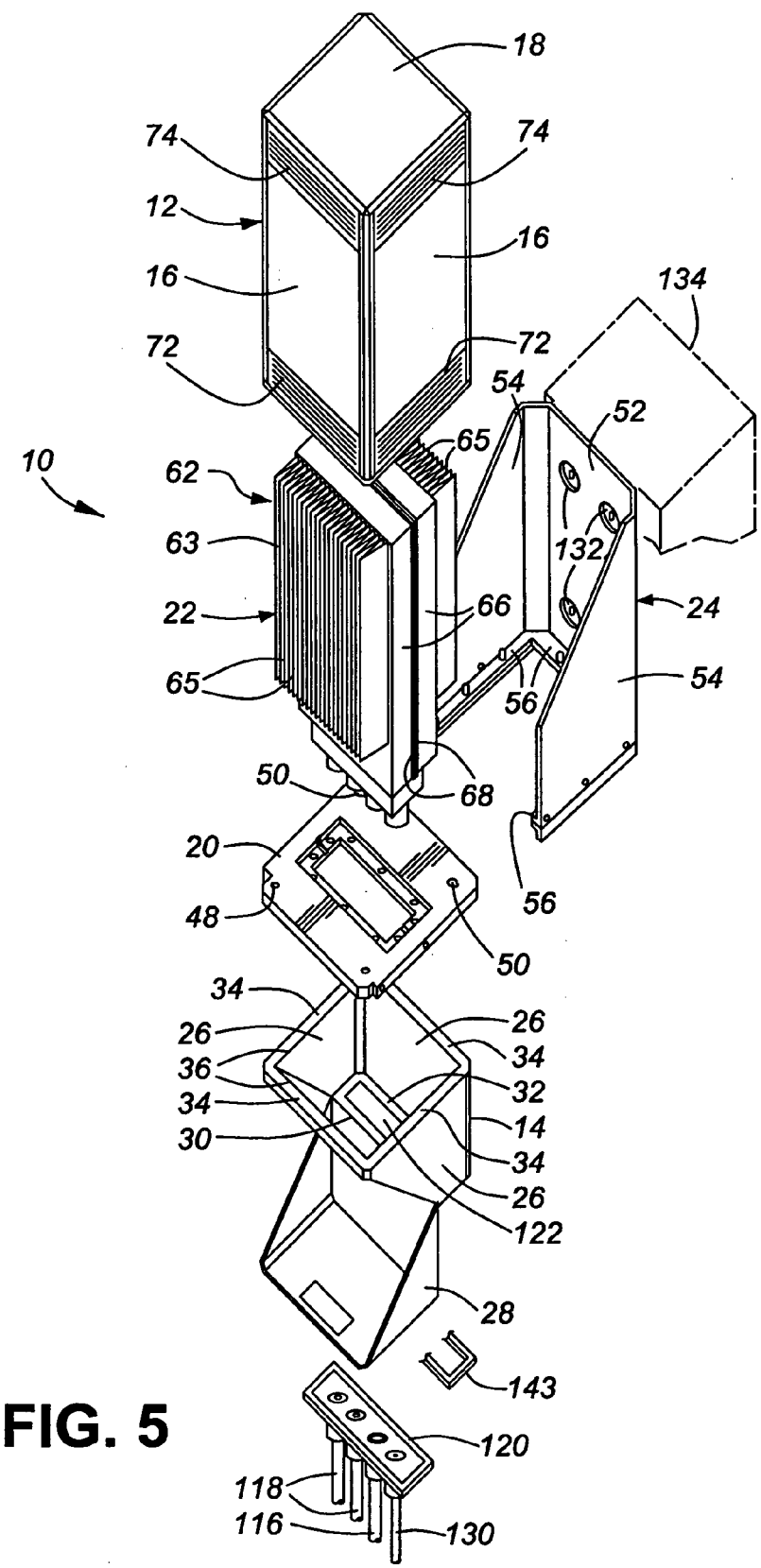
FIG. 5 is an exploded front isometric view of the assembly from the side opposite to FIG. 1.

Basically, as shown by FIGS. 1 and 2, an optical network unit 10 has a housing comprising an upper housing member 12 and a lower housing member 14. As shown particularly by FIG. 5, the upper housing member 12 has four vertically elongate sides 16 and a upper closed end 18 which define part of an upper compartment of the unit. A lower end of the compartment is defined by a housing mount in the form of a horizontal planar plate 20 to which the upper housing member is secured, as will be described. Also as shown by FIG. 5 and other Figures, the upper compartment contains a environmentally sealed printed circuit board arrangement 22, to be further discussed.

The lower housing member 14 is also detachably secured to the plate 20, as is a carrier member 24.

Figure 7:
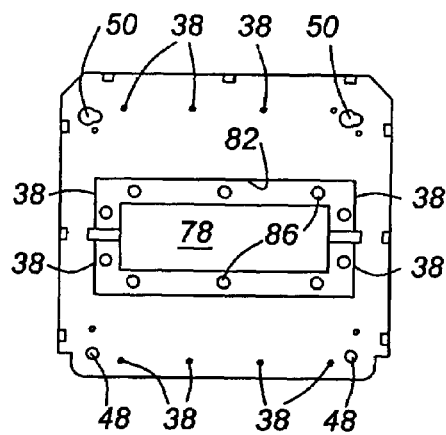
FIG. 7 is a plan view of a housing mount of the optical network unit.

More specifically, as shown for instance, by FIGS. 1, 2, 5, 12 and 13 the lower housing member 14 has three sides 26 which, together with a closure element in the form of a multi-sided door 28, define a lower compartment of the optical network unit. The door 28 is hinged at its bottom edge about a horizontal axis, with the hinge position 30 being inset relative to the upper plan view of the lower housing member so that a relatively small lower end 32 is provided for this housing member. The upper end of the housing member 14 has four inwardly extending flanges 34 provided with screw clearance holes 36 to correspond in position with sixteen screwthreaded holes 38 arranged in four straight lines in the plate 20 (FIG. 7). The lower housing member is detachably assembled to the plate 20 (FIG. 12) by screws 40 (FIG. 13) which extend upwardly through the flanges 34 and into the plate 20.

Figure 8:
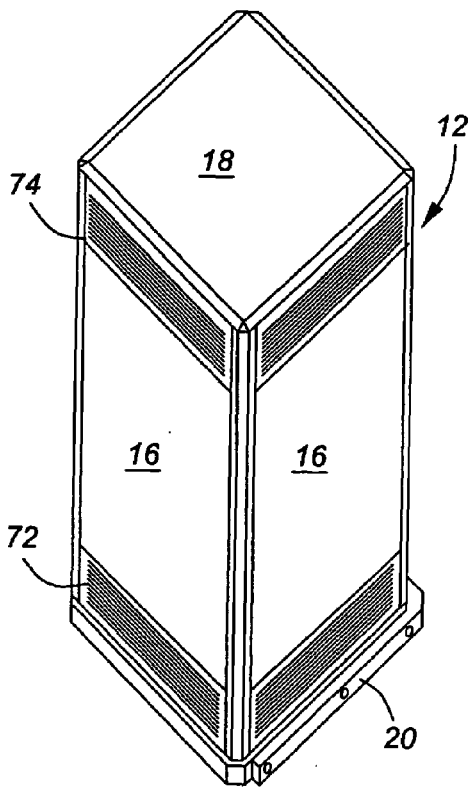
FIG. 8 is a front isometric view of a sub-assembly of the upper housing member and a housing mount.
Figure 9:
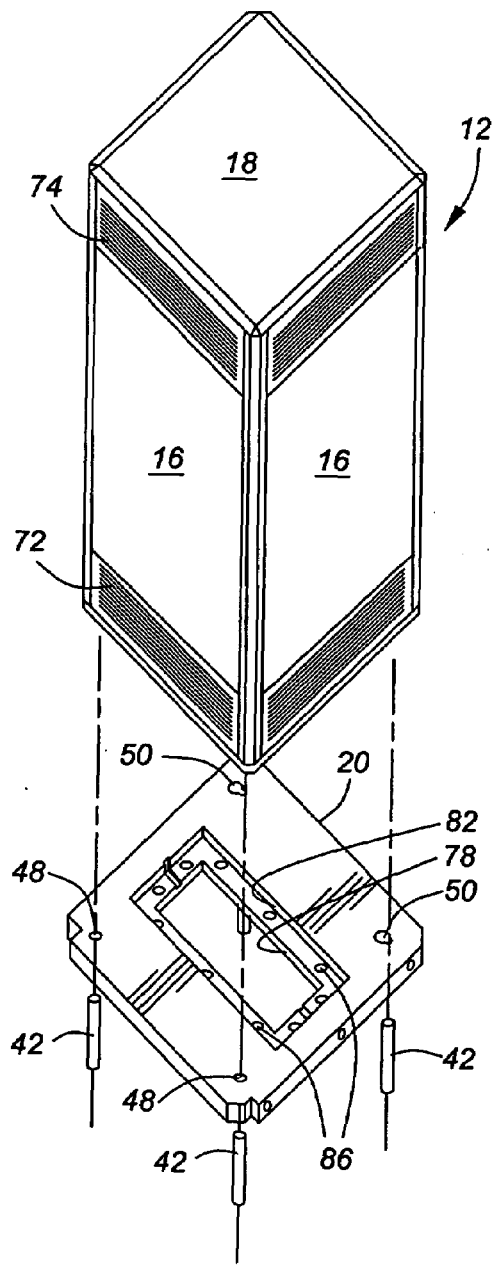
FIG. 9 is an exploded front isometric view of the sub-assembly of FIG. 8.

As shown in FIGS. 8 and 9, the upper housing member 12, is detachably secured to the plate 20 by four upwardly extending screws 42 (three being shown), which pass through clearance holes in the plate and into threaded holes (not shown) in flanges 44 which are turned inwardly from the sides 16 of the upper housing member (FIG. 6). As shown by FIG. 6, the flanges 44 and 34 overlie each other and the flanges 34 are necessarily relieved at positions 46 (FIG. 13) to provide clearance for the heads of the screws 42 into contact with the plate 20. Two circular front clearance holes 48 in the plate 20 are provided to accept screws 42, whereas the rear clearance holes 50 are keyhole shaped. This allows for the two rear screws 42 to be partly inserted into holes in the upper housing member 12, for location and registration purposes through the wide parts of the holes 50 during mounting, and before securing the mounting member in position.

The carrier member 24 has a vertical rear wall 52 and two opposing vertically extending flanges 54 (see particularly FIG. 5). In the assembly, the plate 20, together with the upper housing member 12, lies between these flanges 54, as shown particularly in FIGS. 1, 3 and 4. The rear wall 52 and the flanges 54 have inwardly turned lower ends 56 which lie beneath marginal edge regions of the plate 20 to carry the weight of the optical network unit (FIGS. 6 and 14). The flanges 54 are secured to the plate 20 adjacent to the flanges 54 by horizontally extending tamper-proof screws 58, which pass through the flanges and into screw-threaded holes 60 in the edges of the plate (see FIGS. 14 and 15).

As may be seen from the above, the housing and carrier member structure is particularly simple in design with both the housing members 12 and 14 and the carrier member 24 detachably assembled onto a single feature, i.e. the plate 20. To detach either housing member from the plate 20, the door 28 is lowered to its position shown, for instance, by FIGS. 2 and 13, thereby providing an access opening 61 in the lower housing member 14 for manual removal of the appropriate screws 40 and 42.

A particularly important aspect of the present invention is the environmentally sealed printed circuit board arrangement. In this embodiment, the arrangement 22 is provided for receiving incoming optical and electrical signals from a central office (by means to be described), and for transmitting corresponding electrical signals through a joint wiring interconnect (not shown) to customers' premises. It also serves the function of receiving electrical signals from the customers' premises to return these as corresponding electrical and optical signals to the central office for dialled distribution.

The arrangement 22 comprises a housing 62 (FIGS. 5, 10, 11 and particularly FIG. 19) within which a plurality of printed circuit boards or line cards, to be described, are environmentally protected. The housing 62 comprises two housing halves 63 each of which has a finned main wall 64, the fins 65 of which are vertical heat exchange fins. From one side of the main wall 64 extend two long vertical side walls 66 and two relatively short top and bottom walls 67 and 67a, which extend between and are joined to the side walls 66. Free ends of the walls define a rectangular opening and terminate in a continuous outwards flange 68 surrounding the opening.

The two housing halves are secured together at the free ends of side, top and bottom walls, with an environmental and EMI seal 69 disposed between free ends of the walls and between the flanges 68. The seal 69 is a composite environmental and EMI seal. However, as is known generally in the art for sealing purposes, separate EMI and environmental seals may be provided. Screws (not shown) pass from flange to flange 68 to hold the housing halves 63 assembled with the seal 69 compressed between the housing halves. An environmentally sealed chamber 70 is thus formed between the housing halves.

The chamber 70 houses four printed circuit boards 71 and 73 to provide the required electronic function of the unit 10. The printed circuit boards are assembled on to the two housing halves 63 before these are secured together. A printed circuit board 71 is secured to the main wall 64 of each housing half 63 by heat conductive screws 75. These pass through the printed circuit board 71 in heat conductive relationship to a ground plane (not shown) of the board and into the associated wall 64 of the housing half. Each printed circuit board 71 is spaced from its associated wall 64 by heat conductive (e.g. copper) spacers which surround the screws 75. The screws 75 are disposed in horizontally spaced vertical rows across the board 71, one vertical row of three screws being shown for each board 71 in FIG. 19. All of these screws are aligned, each vertically with an associated fin 65 and extend, into the bases of the fins to shorten the heat exchange paths into the fins.

Each printed circuit board 71 has a spaced and parallel printed circuit board 73 attached to it, each board 71 joined to its board 73 by connectors 77 between top and bottom end regions of the boards.

A flexible ribbon cable or flex circuit 79 connects top end regions of the printed circuit boards 71 and a power board 81 is secured to the main wall 64 in lower regions of one of the housing halves 63, heat conductive screws 83 and spacers 85 being used for this purpose. These screws extend into bases of the fins 65 as shown in FIG. 19.

The housing 62 is formed from a suitable heat exchange material, in this embodiment aluminum, but other heat exchange materials may be used. To preserve the surface of the housing 61 in all types of environmental conditions, the housing is subjected to the known irriditing process followed by a protective paint coating such as polyurethane.

Figure 10:
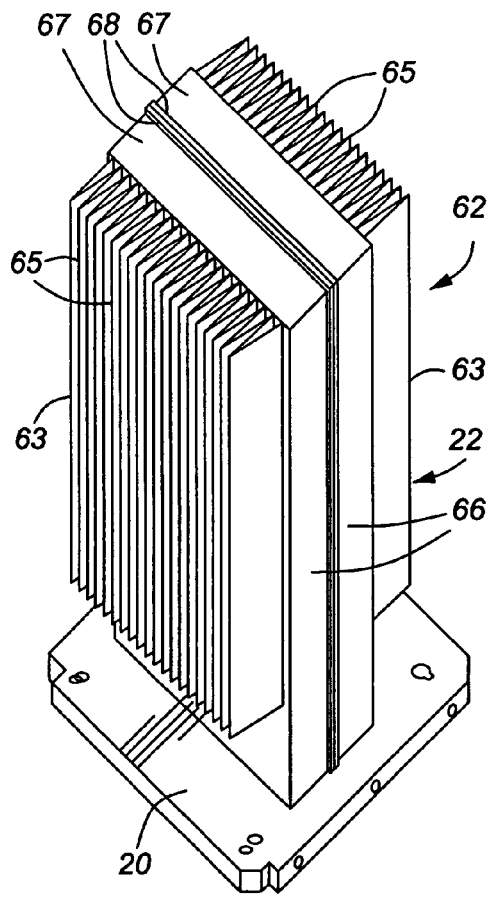
FIG. 10 is a front isometric view of a sub-assembly of an environmentally sealed printed circuit board arrangement and the housing mount.
Figure 11:
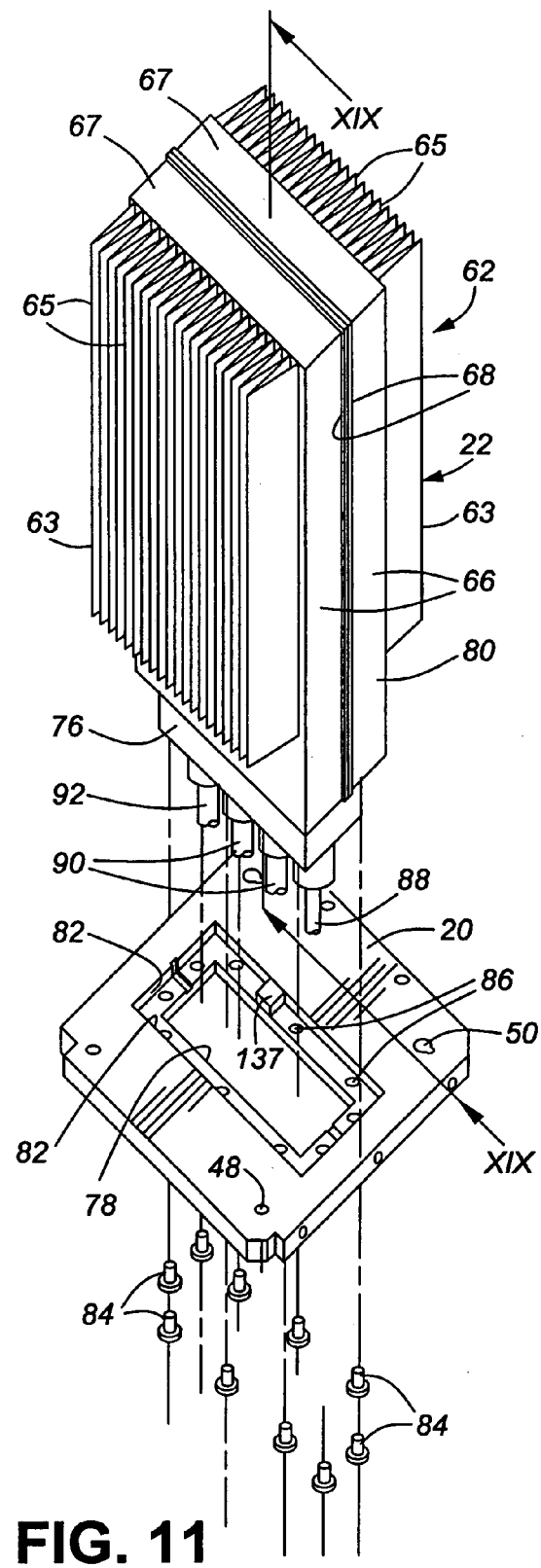
FIG. 11 is an exploded front isometric view of the sub-assembly of FIG. 10.

In the assembled housing 62, the fins 65 extend from both front and rear surfaces of the housing (see FIGS. 10, 11 and 19). These fins 65 extend into airflow passages 87 defined between the fins and the inside surfaces of sides 16 of the upper housing member 12 (FIG. 19). The vertical side walls 66 are also spaced from the sides 16 (this not being shown).

In use, heat generated by the printed circuit boards is to be conducted away by the fins to dissipate this heat into the atmosphere. To create a necessary convection air flow up through the passages 87, the sides 16 of the upper housing member 12 are provided with vertically spaced air vents, i.e. upper and lower air vents 72 and 74. In use the cool air will enter the lower vents 72 and pass upwardly through the airflow passages 87 to extract heat, the heated air then passing into ambient atmosphere through the upper vents 74.

To assist in ensuring that the printed circuit board arrangement 22 does not become overheated because of ambient temperature conditions or exposure to direct sunlight, the housing member 12 is desirably made with low heat conducting characteristics and thus forms a solar shield. Such a structure may be made by any suitable molding or fabrication process, applicable to the material from which it is being made, which may be certain plastics or metals. An appropriate plastic foam material is envisaged which may include a glass fiber reinforcement. Such a structure complies with GR-950 CORE and GR-487 CORE.

Figure 12:
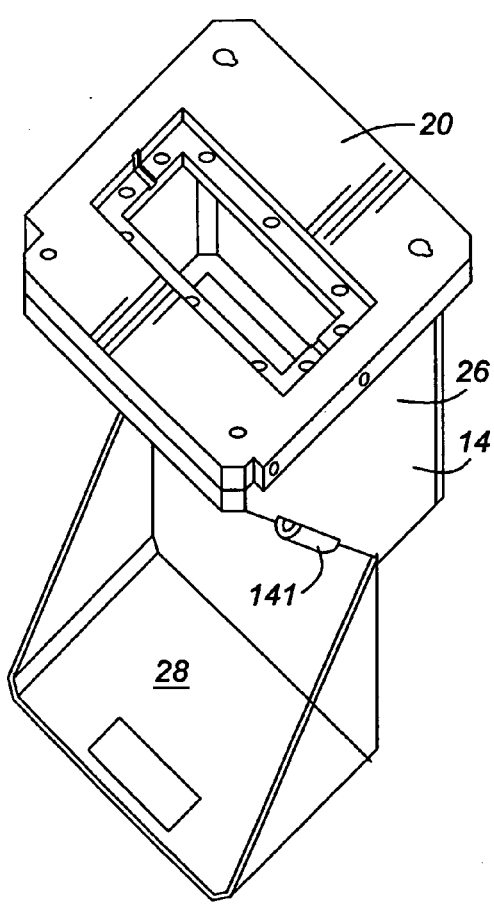
FIG. 12 is a front isometric view of a sub-assembly of the lower housing member and the housing amount.
Figure 13:
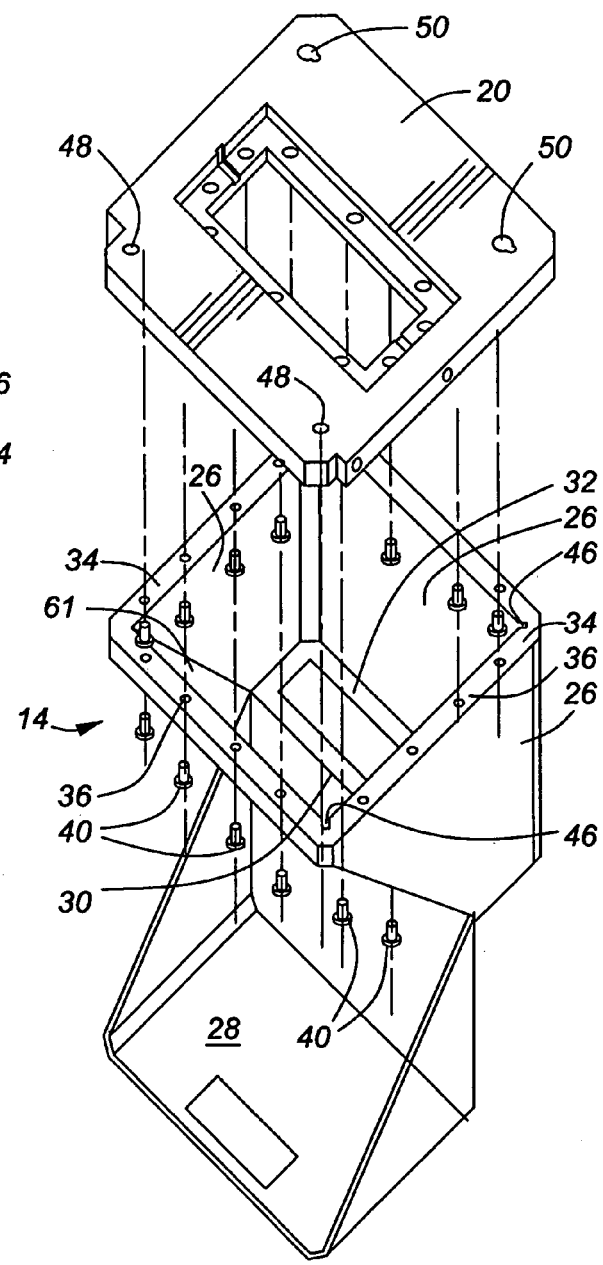
FIG. 13 is an exploded front isometric view of the sub-assembly of FIG. 12.

The printed circuit board arrangement 22 is also assembled in detachable fashion to the plate 20. This is as shown by FIGS. 10 and 11 in which the lower end of the arrangement 22 has a downwards extension 76 (see also FIG. 19) which registers within a rectangular orifice 78 within the plate 20 with the end 80 of the arrangement 22 supported by the plate 20 within a well defined by edges 82 of the plate. Upwardly extending screws 84 extend through clearance holes 86 in the plate 20 and into the end 80 of the arrangement 22 for securing purposes. These screws 84 are also accessible from within the lower compartment with the door 28 in the open position, for instance as shown by FIGS. 12 and 13.

As may be seen from the above description, each of the housing members 12 and 14, the carrier member 24 and the printed circuit board arrangement 22 are detachably secured to the housing mount, i.e. plate 20. This is a conveniently designed structure for the following reasons.

For initial installation, the optical network unit 10 is factory assembled, as shown in FIG. 1. In this condition, (FIG. 11) the printed circuit board arrangement 22 has incoming and outgoing short optical cable, 88, two short electrical transmission cables 90 and a short electrical power cable 92, extending in environmentally sealed relationship between the bottom walls 67a of the housing halves 63 and into the environmentally sealed chamber 70. As shown by FIG. 19, the power cable 92 is connected to the power board 81, the optical cable 88 is connected to one of the printed circuit boards 71 and the electrical transmission cables 90 are connected one to each of the printed circuit boards 73.

After installation, within the lower compartment, a signal in/out arrangement is provided. This comprises passive electrical and optical components. These include protectors 94 and 96 for preventing electrical surges from reaching the printed circuit boards 62, and a slack fiber management device 98 for optical cable (FIGS. 2, 3, 4, 16 and 17). The short telecommunications electrical cables 90 are interconnected by environmentally sealed connectors 100 to other cable lengths 102 which extend from the protectors 94. A sealed connector 104 (FIG. 17) also connects the power cable 92 to a power cable 106 extending from its protector 96. Short cable lengths 110, 112, extend from the other sides of environmentally sealed protectors 94 and 96, to be joined by environmentally sealed connectors 114 to power and electrical transmission cables 116 and 118, respectively, (see also FIG. 5). The cables 116 and 118 pass through and are environmentally sealed to a rectangular base plate 120 of the housing member 14 (FIG. 5), the base plate 120 being secured in position and environmentally sealing a rectangular aperture 122 at the lower end of housing member 14.

One of the transmission cables 90 is connected to the central office while the other cable 90 is interconnected into the joint wiring interconnect (not shown) for interconnection to customers' premises.

The optical cable 88 (FIGS. 3, 11 and 16) extends into the slack fiber management device 98 to be joined by connector 124 to a coiled superfluous length optical cable 126, joined by connector 128 to optical cable 130. This cable extends from the device 98 to be interconnected to the central office. The cable 130 is also environmentally sealed into the base plate 120, as shown by FIG. 5.

Figure 16:
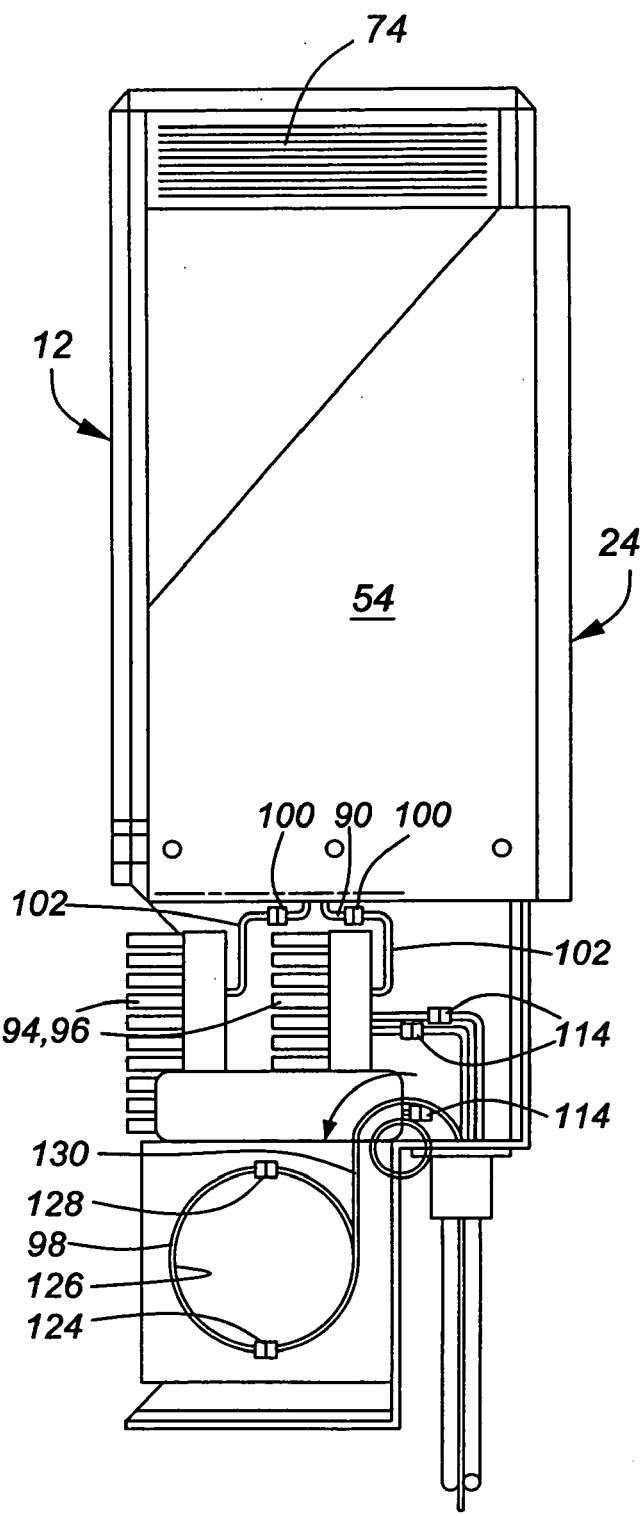
FIG. 16 is a view similar to FIG. 3 and showing optical transmission features removed from within the lower housing member.
Figure 17:
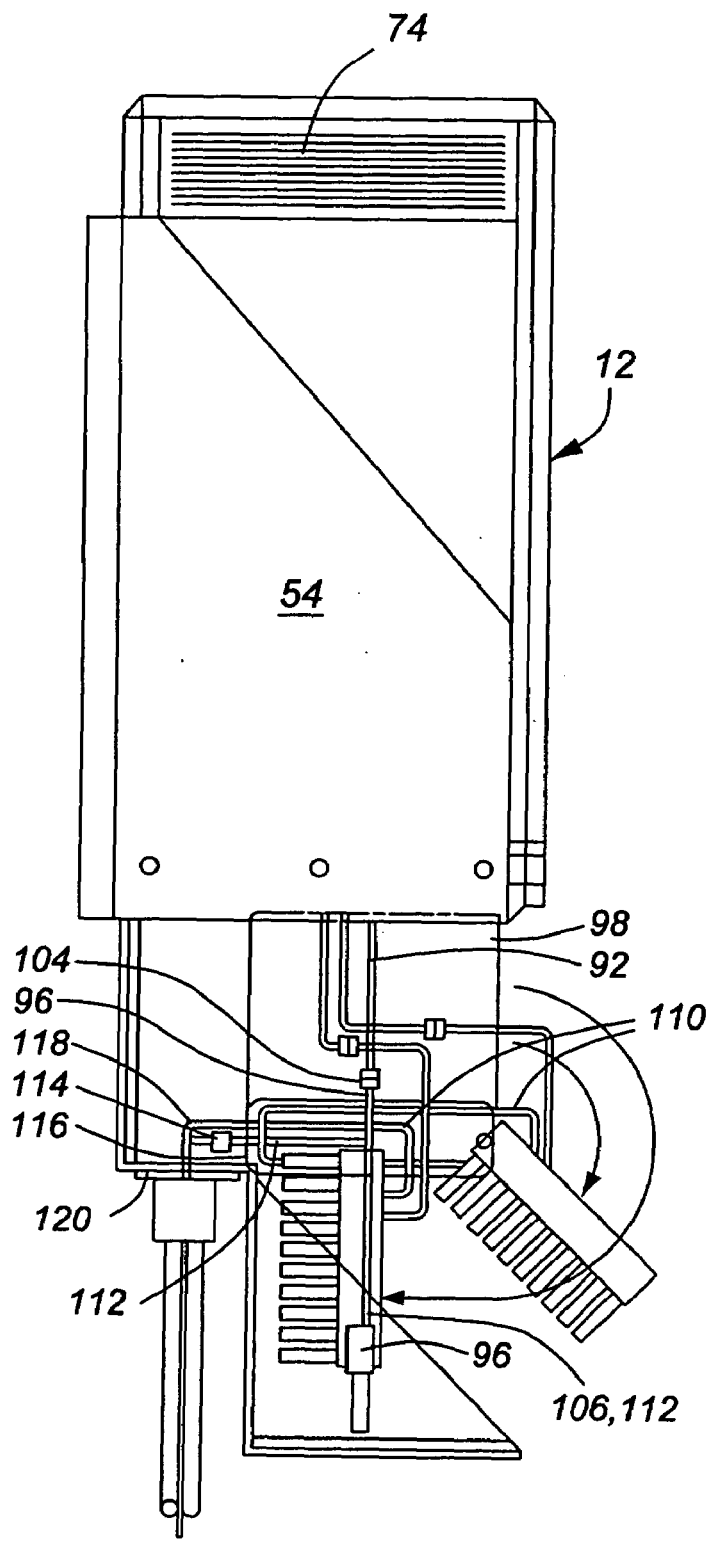
FIG. 17 is a view similar to FIG. 4 and showing electrical features removed from within the lower housing member.

During installation of the unit 10, the carrier member 24 (FIG. 5) is secured by screws (not shown) passing through keyhole shaped clearance holes 132 (FIG. 14) into an upstanding pedestal 134, or horizontal support (not shown), the clearance holes assisting in screw location. After installation of the factory assembled unit 10 using screws 58 through the carrier member 24 and into plate 20 (FIGS. 14 and 15), the passive electrical and optical components are then added into the housing member 14 to complete the assembly and interconnect the arrangement 22 in the desired manner to power, central office and customers' premises. To successfully connect all cables together within the housing member 14, the protectors 94 and 96 and slack fiber management device 98 need to be outside and in front of the housing member 14 for access purposes, as shown in FIGS. 16 and 17 with the door 28 open. Hence, although not shown in the drawings (particularly FIGS. 3 and 4), the cables 88, 90, 102, 106, 110 and 112 need to be sufficiently long for their ends to be drawn from within the housing member 14 for connection purposes. After connections are made, the protectors 94 and 96, and the fiber management device 98, are moved into stowed positions (FIGS. 3 and 4) upon slides (not shown) within the housing member 14. The door 28 is then closed and secured with a tamper-proof lock 136 (FIG. 1).

During use, in the event of a breakdown or malfunction of one or more of the printed circuit boards 71, 73 and 81, any problem deciding which board is at fault or in removing a correctly operating printed circuit board, instead of a faulty one, is avoided. This is because the printed circuit board arrangement 22 with its environmentally sealed housing 62, denies direct access to any of the printed circuit boards for removal and exchange purposes. Thus, increase in downtime due to human error is avoided. Instead, with structures according to the invention and as exemplified by the embodiment, the whole of the printed circuit board arrangement 22 needs to be replaced by a new arrangement 22. As will be appreciated, such removal and replacement is a rapid, simple and positive operation.

A pre-built factory assembly may be made of the arrangement 22, the plate 20 and the lower housing member 14 which contains the cables and cable lengths such as items 90, 92, 102 and 130, referred to above, and protectors 94 and 96, the slack fiber management device 98 and the connectors such as items 100, 114, 124 and 128. The lower housing member 14 may thus be sealed under factory controlled conditions to provide environmental sealing to the lower compartment, or lower chamber. For this sealing purpose, seals, for instance gaskets, are provided between mating surfaces. In the embodiment these include a gasket 137 beneath end 80 of the arrangement 22 (FIG. 11), gasket 139 between flanges 34 of housing member 14 and the plate 20 (FIG. 6), gasket 141 around the opening to door 28 (FIG. 12) and gasket 143 between lower end 32 of the lower housing member and base plate 120 (FIG. 5). All of the gaskets are partially shown only. This factory installed environmental sealing also involves relatively short lengths of cables 116, 118 and 130, extending from the sealed lower compartment for connection to appropriate longer lengths (not shown) outside the unit 10 for signal transmission and power input to the unit as desired.

Replacement of the arrangement 22 in the unit 10 is necessarily effected by first opening the door 28 to provide access through the opening 61. After removal of the protectors 94 and 96 and the fiber management device 98 to the position shown in FIGS. 16 and 17, the cables 88, 90 and 92 are disconnected and the screws 42 are removed to allow for removal of the housing member 12 from the plate 20. At this point, the arrangement 22 is fully exposed (FIGS. 10 and 18) extending upwards from the plate 20 and is easily removed by firstly removing screws 84 (FIG. 11). The arrangement 22 is then replaced with the new, unused and factory prebuilt environmentally sealed arrangement 22. As may be seen, with this structure of the embodiment, customers' service may be returned in the shortest possible time, while minimizing human error.

Further, with the environmentally sealed arrangement 22 in its compartment, apart from moving the passive elements forwards in the housing member 14 for access purposes, as discussed, further interference with these elements for removal of the arrangement 22 is avoided. Also, should any of the protectors 94, 96 require replacement, this may be done simply by opening the door 28 without any contact or interference with the contents of the housing member 12 being necessary.

In addition, the design of the optical network unit 10, together with the carrier member 24, is practical for other reasons. As the housing members 12 and 14, and the carrier member 24 are detachably secured to the plate 20, should the need arise to replace a housing or carrier member, perhaps because of damage thereto, this is easily effected. The complete unit 10 may be removed from the carrier member 24 merely by removing the screws 58 with an appropriate tool to allow for change of the carrier member. Alternatively, should it be necessary to replace either or both housing members 12 and 14, manual access to the appropriate screws through opening 61 is easily effected with the plate 20 remaining secured to the carrier member 24. Further, it is possible to replace either housing member, together with the plate 20 as a sub assembly, should the need arise. This is shown by the two sub-assemblies of plate 20 and housing members 12 and 14, in FIGS. 8 and 12.

Figure 20:
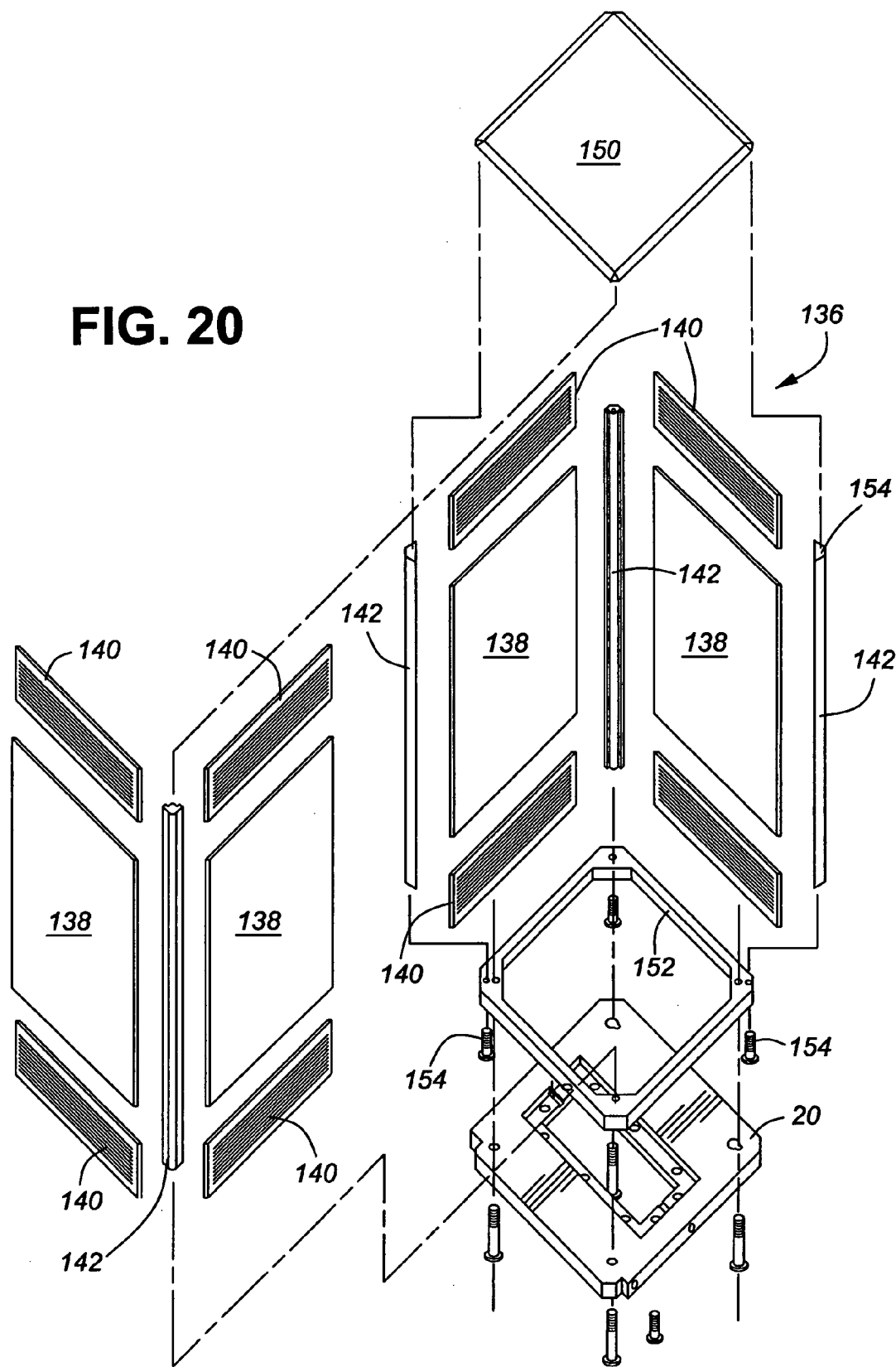
FIG. 20 is an isometric exploded view according to one modification of the embodiment.
Figures 21, 22:
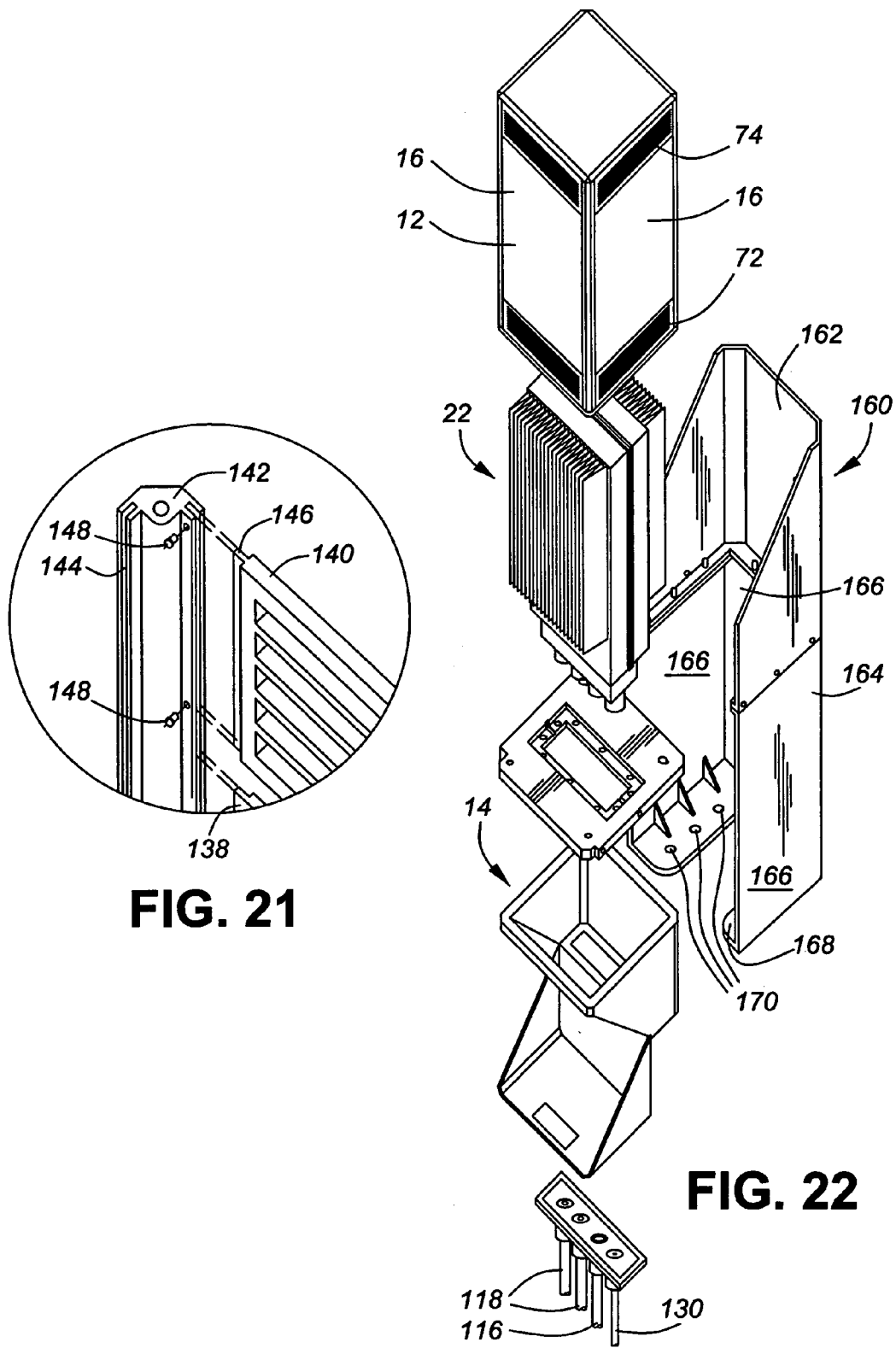
FIG. 21 is an enlarged scrap isometric view of the modified part of the unit of FIG. 20.
FIG. 22 is a view similar to FIG. 2 of a modification to the assembly.

There is a further advantage with a design of a unit 10 having two housings, each assembled onto a housing mount or plate 20. If, after insulation, advancements in design or technology enable a smaller hermetically enclosed printed circuit board arrangement to be provided to replace the arrangement 22 described, then the smaller unit may be used if its lower regions are suitable for securing into the well formed by edges 82 of the plate 20. With this considered as a possibility, the housing member 20 may be replaced in one modification, by a housing member 136, but made in sections as shown in FIGS. 20 and 21. The member 136 has side panels 138 and vent panels 140 which provide sides of the member when assembled together. Vertical corner elements 142 detachably secure the panels together to form the sides of the member 136. The corner elements 142 have vertical slots 144 to receive narrow edge regions 146 of the panels. Screws 148 are then used to secure the edge regions 146 into the slots. A closed top 150 and an open bottom framework 152 hold the carrier elements 142 in position by screws 154. With the housing member 136 of the same size and shape in plan view as the housing member 12, the member 136 is attached to the plate by the screws 42 as in the embodiment.

Should a shorter design of printed circuit board arrangement be constructed and use as a replacement for the arrangement 22, then the member 136 may be made appropriately shorter to decrease the total size of the optical network unit. This is done by dismantling the member 136 by either reducing the height of each panel 138 or by replacing it with a shorter panel and correspondingly reducing the length of each corner element 142.

In a further embodiment, as shown by FIG. 22, in which the optical network unit is as described in the embodiment, the carrier member 24 is replaced by another carrier member 160 for mounting the unit 10 to a different support. The carrier member 160 has an upper element 162 similar to the carrier member 24 but having the holes 132 omitted. A lower element 164 is attached to the upper element 162 by screws (not shown). The lower element has three sides 166, two of which have inwardly turned flanges 168 provided with bolt holes 170. It is intended that bolts should be passed through the holes 170 to mount the carrier member 160 onto a concrete slab (not shown).

In yet a further embodiment (not shown), the environmentally sealed printed circuit board arrangement 22 has, at its lower end region, a plurality of visual indicators which face forwardly of the unit 10, these indicators provided for the purpose of showing whether the sealed printed circuit boards are receiving power and whether the operational status of the product is in active mode or in failure mode. These indicators provide an interface which may accommodate wired and/or wireless communication interfaces for hand held terminal devices for the purpose of indicating product configuration and/or diagnostics through external administrative software. To reach the indicators, the front lower air vent 72 is provided as part of a hingeable door directly in line with the indicators.

What is claimed is:

1. An optical network unit comprising:
   a first housing member defining at least part of a first sealed compartment;
   an environmentally sealed printed circuit board arrangement located within the first compartment; the environmentally sealed printed circuit board arrangement which is removeable from the optical network unit while remaining sealed after being removed;
   a second housing member defining at least part of a second compartment;
   a telecommunications signal in/out arrangement located within the second compartment and interconnected for signal transmission to the printed circuit board arrangement.

2. An optical network unit according to claim 1, wherein a housing mount is provided, each of the housing members being detachably assembled to the housing mount.

3. An optical network unit according to claim 2, wherein signal transmission members extend from the signal in/out arrangement to printed circuit boards of the printed circuit board arrangement, through the housing mount and are environmentally sealed into the printed circuit board arrangement.

4. An optical network unit according to claim 2, wherein the printed circuit board arrangement is also detachably assembled to the housing mount.

5. An optical network unit according to claim 4, wherein the first and second housing members are assembled to opposite sides of the housing mount and the second housing member includes a closure element which is movable into and out of a position in which it closes an access opening to the second compartment and each of the housing members is secured to the housing mount by securing means accessible through the access opening and into the second compartment to enable removal of the housing members from the housing mount.

6. An optical network unit according to claim 5, wherein the printed circuit board arrangement is detachably assembled to the housing mount by another securing means accessible through the access opening and, after removal of the first housing member, the printed circuit board arrangement is removable from the housing mount while the second housing member remains assembled to the housing mount.

7. An optical network unit according to claim 5, wherein the first housing member has sides and one end defining part of the first compartment and the housing mount also defines part of the first compartment, and, upon removal of the first housing member from the housing mount, the printed circuit board arrangement is in a fully exposed position extending from the housing mount.

8. An optical network unit according to claim 1, wherein vertically spaced air vents are provided in the first housing member, and an airflow passage is defined between the first housing member and the printed circuit board arrangement to promote heat removal from the printed circuit board arrangement by convection air flow for cooling air to enter the lower vent, and pass upwards through the passage to collect heat, and for heated air to exit through the upper vent.

9. An optical network unit according to claim 8, wherein the printed circuit board arrangement has heat exchange fins extending into the airflow passage.

* * * * *